(12) United States Patent
Huang et al.

(10) Patent No.: US 11,317,503 B2
(45) Date of Patent: Apr. 26, 2022

(54) CIRCUIT BOARD AND MANUFACTURING METHOD THEREOF

(71) Applicant: SHENNAN CIRCUITS CO., LTD., Shenzhen (CN)

(72) Inventors: Lixiang Huang, Shenzhen (CN); Zedong Wang, Shenzhen (CN); Hua Miao, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 0 days.

(21) Appl. No.: 17/134,488

(22) Filed: Dec. 27, 2020

(65) Prior Publication Data

US 2022/0015224 A1    Jan. 13, 2022

Related U.S. Application Data

(63) Continuation of application No. PCT/CN2020/127009, filed on Nov. 6, 2020.

(30) Foreign Application Priority Data

Jul. 7, 2020    (CN) .......................... 202010645947.3

(51) Int. Cl.
*H05K 1/03* (2006.01)
*H05K 1/02* (2006.01)
(Continued)

(52) U.S. Cl.
CPC ......... *H05K 1/0218* (2013.01); *H01L 23/498* (2013.01); *H01L 25/0652* (2013.01);
(Continued)

(58) Field of Classification Search
CPC . H05K 1/0218; H01L 23/498; H01L 25/0652; H01L 25/50
(Continued)

(56) References Cited

U.S. PATENT DOCUMENTS

2014/0003012 A1\* 1/2014 Lee ......................... H05K 1/185
361/763
2016/0174381 A1   6/2016 Lee et al.
(Continued)

FOREIGN PATENT DOCUMENTS

CN    102097427 A    6/2011
CN    103703874 A    4/2014

OTHER PUBLICATIONS

International search report, International Application No. PCT/CN2020/127009, dated Apr. 6, 2021 (9 pages).

*Primary Examiner* — Andargie M Aychillhum

(57) ABSTRACT

A circuit board is provided, including: a core board, defining a plurality of slots, the plurality of slots including a plurality of first sub-slots and a plurality of second sub-slots disposed beneath the first sub-slots. Each of the second sub-slots is located beneath a corresponding first sub-slot of the first sub-slots; and a plurality of chip assemblies, arranged in the slots and including a plurality of first chips located in the first sub-slots and a plurality of second chips located in the second sub-slots. Each of the first chips is connected in series with one of the second chips at a corresponding position to form a plurality of chipsets; the chipsets are connected in parallel with each other; an end of the chipsets is connected to a first power signal layer, and the other end of the plurality of chipsets is connected to a ground layer.

16 Claims, 4 Drawing Sheets

(51) Int. Cl.
  *H05K 3/46*     (2006.01)
  *H01L 25/00*    (2006.01)
  *H01L 25/065*   (2006.01)
  *H01L 23/498*   (2006.01)

(52) U.S. Cl.
  CPC .......... *H01L 25/50* (2013.01); *H05K 3/4644* (2013.01); *H05K 2201/09063* (2013.01)

(58) Field of Classification Search
  USPC ........................................................ 174/255
  See application file for complete search history.

(56) References Cited

U.S. PATENT DOCUMENTS

2017/0231094 A1\* 8/2017 Blackshear ............ H05K 1/185
2020/0111748 A1   4/2020 Leitgeb \* cited by examiner The second insulating layer defines a first conductive hole at a position corresponding to the first connection terminal of the first chip, the first insulating layer defines a second conductive hole at a position corresponding to the second connection terminal of the second chip, a third conductive hole is defined between the first chip and the second chip through the core board, the first insulating layer, and the second insulating layer. In this way, the first connection terminal of the first chip is connected to the second connection terminal of the second chip. — S71

A fifth conductive hole is defined at a position of the first insulating layer corresponding to the second connection terminal of the first chip to connect the second connection terminals of each first chip to the first power signal layer. A sixth conductive hole is defined at a position of the second insulating layer corresponding to the first connection terminal of the second chip to connect the first connection terminals of each second chip to the ground layer. — S72

A fourth conductive hole is defined at a position of the first insulating layer corresponding to the third connection terminal of the first chip and that of the second chip to connect the third connection terminals of the first chip and the second chip to the control signal layer. — S73

FIG. 7

CIRCUIT BOARD AND MANUFACTURING METHOD THEREOF

CROSS REFERENCE

The present application is a continuation-application of International (PCT) Patent Application No. PCT/CN2020/127009, filed on Nov. 6, 2020, which claims foreign priority of Chinese Patent Application No. 202010645947.3, filed on Jul. 7, 2020 in the National Intellectual Property Administration of China, the entire contents of which are hereby incorporated by reference in its entirety.

TECHNICAL FIELD

The present disclosure relates to the field of chip embedding technologies, and in particular to a circuit board and a manufacturing method thereof.

BACKGROUND

With the increasing sophistication of the circuit board preparation process, the electronic packaging technology is becoming more and more mature.

Nowadays, the electronic packaging shall not only provide a chip protection, but also meet increasing demands for performance, reliability, heat dissipation, power distribution, etc. At the same time, users have demands for ultra-thin, miniature, and multi-functions, while existing boards are not well integrated in the manufacturing process, and power consumption and cost thereof are relatively high.

Therefore, it is necessary to provide a highly integrated, low power and low cost circuit board.

SUMMARY OF THE DISCLOSURE

The present disclosure provides a circuit board and a manufacturing method thereof.

A circuit board is provided, including: a core board, defining a plurality of slots, the plurality of slots including a plurality of first sub-slots and a plurality of second sub-slots disposed beneath the plurality of first sub-slots; wherein each of the second sub-slots is located beneath a corresponding first sub-slot of the plurality of first sub-slots; and a plurality of chip assemblies, arranged in the plurality of slots and including a plurality of first chips located in the plurality of first sub-slots and a plurality of second chips located in the plurality of second sub-slots. Each of the plurality of first chips is connected in series with one of the plurality of second chips at a corresponding position to form a plurality of chipsets; the plurality of chipsets are connected in parallel with each other; an end of the plurality of chipsets is connected to a first power signal layer, and the other end of the plurality of chipsets is connected to a ground layer.

The circuit board further includes: a first line layer, arranged on a side of the core board; a second line layer, arranged on a side of the core board away from the first line layer; a first insulating layer, arranged between the core board and the first line layer; and a second insulating layer, arranged between the core board and the second line layer. The first line layer includes a first power signal layer and a control signal layer; the second line layer includes a ground layer and a second power signal layer.

The circuit board further includes: a first power signal layer, arranged on a side of the core board; a second power signal layer, arranged on a side of the core board away from the first power signal layer; a first insulating layer, arranged between the core board and the first power signal layer; a second insulating layer, arranged between the core board and the second power signal layer; a control signal layer, arranged on a side of the first power signal layer away from the core board; a ground wire layer, arranged on a side of the second power signal layer away from the core board; a third insulating layer, arranged between the first power signal layer and the control signal layer; and a fourth insulating layer, arranged between the second power signal layer and the ground layer.

Each of the plurality of first chips and each of the plurality of second chips includes a second connection terminal and a third connection terminal arranged on a side near the first line layer, and a first connection terminal arranged on a side near the second line layer; the first connection terminal of one of the plurality of first chips is coupled to the second connection terminal of one of the plurality of second chips at a corresponding position; the second connection terminal of one of the plurality of first chips is coupled to the first power signal layer; the third connection terminal of one of the plurality of first chips is coupled to the control signal layer, the third connection terminal of one of the plurality of second chips is coupled to the control signal layer; the first connection terminal of one of the plurality of second chips is connected to the ground layer.

A first conductive hole is defined at a position of the second insulating layer corresponding to the first connection terminal of one of the plurality of first chips, to connect the second power signal layer to the first connection terminal of one of the plurality of first chips; a second conductive hole is defined at a position of the first insulating layer corresponding to the second connection terminal of one of the plurality of second chips, to connect the first power signal layer to the second connection terminal of one of the plurality of second chips; a third conductive hole is defined between one of the plurality of first chips and one of the plurality of second chips, to connect the first power signal layer to the second power signal layer, such that the first connection terminal of one of the plurality of first chips is connected to the second connection terminal of one of the plurality of second chips; each of the plurality of first chips and one of the plurality of second chips at a corresponding position are thus connected in series to form the plurality of chipsets.

A fourth conductive hole is defined at a position of the first insulating layer corresponding to the third connection terminal of one of the plurality of first chips and the third connection terminal of one of the plurality of second chips to connect the third connection terminal of one of the plurality of first chips and the third connection terminal of one of the plurality of second chips to the control signal layer; or, a fourth conductive hole is defined at a position of the first insulating layer corresponding to the third connection terminal of one of the plurality of first chips and the third connection terminal of one of the plurality of second chips, and defined at a position of the third insulating layer corresponding to the third connection terminal of one of the plurality of first chips and the third connection terminal of one of the plurality of second chips, to connect the third connection terminal of one of the plurality of first chips and the third connection terminal of one of the plurality of second chips to the control signal layer.

A fifth conductive hole is defined at a position of the first insulating layer corresponding to the second connection terminal of one of the plurality of first chips to connect the second connection terminal of one of the plurality of first chips to the first power signal layer; a sixth conductive hole is defined at a position of the second insulating layer corresponding to the first connection terminal of one of the plurality of second chips to connect the first connection terminal of one of the plurality of second chips to the ground layer; or, a fifth conductive hole is defined at a position of the first insulating layer corresponding to the second connection terminal of one of the plurality of first chips to connect the second connection terminal of one of the plurality of first chips to the first power signal layer; a sixth conductive hole is defined at a position of the second insulating layer corresponding to the first connection terminal of one of the plurality of second chips, and defined at a position of the fourth insulating layer corresponding to the first connection terminal of one of the plurality of second chips, to connect the first connection terminal of one of the plurality of second chips to the ground layer.

A method for manufacturing a circuit board is provided, including: providing a circuit board; defining a plurality of slots on the core board, the plurality of slots including a plurality of first sub-slots and a plurality of second sub-slots disposed beneath the plurality of first sub-slots; wherein each of the plurality of second sub-slots is located beneath a corresponding first sub-slot of the plurality of first sub-slots; and arranging a plurality of chip assemblies in the plurality of slots, the plurality of chip assemblies including a plurality of first chips located in the plurality of first sub-slots and a plurality of second chips located in the plurality of second sub-slots; wherein each of the plurality of first chips is connected in series with one of the plurality of second chips at a corresponding position to form a plurality of chipsets; the plurality of chipsets are connected in parallel with each other; an end of the plurality of chipsets is connected to a first power signal layer, and the other end of the plurality of chipsets is connected to a ground layer.

After the arranging the plurality of chip assemblies in the plurality of slots, the method further includes: arranging a first line layer on a side of the core board, and arranging a second line layer on a side of the core board away from the first line layer, the first line layer including a first power signal layer and a control signal layer, the second line layer including a ground layer and a second power signal layer; and arranging a first insulating layer between the core board and the first line layer, and arranging a second insulating layer between the core board and the second line layer; or, arranging a first power signal layer on a side of the core board, and arranging a second power signal layer on a side of the core board away from the first power signal layer; arranging a first insulating layer between the core board and the first power signal layer, and arranging a second insulating layer between the core board and the second power signal layer; arranging a control signal layer on a side of the first power signal layer away from the core board, and arranging a ground wire layer on a side of the second power signal layer away from the core board; and arranging a third insulating layer between the first power signal layer and the control signal layer, and arranging a fourth insulating layer between the second power signal layer and the ground layer.

The method further includes: defining a first conductive hole at a position of the second insulating layer corresponding to a first connection terminal of one of the plurality of first chips, defining a second conductive hole at a position of the first insulating layer corresponding to a second connection terminal of one of the plurality of second chips, and defining a third conductive hole between one of the plurality of first chips and one of the plurality of second chips through the core board, the first insulating layer, and the second insulating layer, such that the first connection terminal of one of the plurality of first chips is connected to the second connection terminal of one of the plurality of second chips; defining a fifth conductive hole at a position of the first insulating layer corresponding to a second connection terminal of one of the plurality of first chips to connect the second connection terminal of one of the plurality of first chips to the first power signal layer; and defining a sixth conductive hole at a position of the second insulating layer corresponding to a first connection terminal of one of the plurality of second chips to connect the first connection terminal of one of the plurality of second chips to the ground layer; and defining a fourth conductive hole at a position of the first insulating layer corresponding to a third connection terminal of one of the plurality of first chips and a third connection terminal of one of the plurality of second chips to connect the third connection terminal of one of the plurality of first chips and the third connection terminal of one of the plurality of second chips to the control signal layer.

BRIEF DESCRIPTION OF THE DRAWINGS

To further illustrate technical solutions of embodiments of the present disclosure, drawings needed for description of the embodiments will be briefly introduced. Obviously, the following drawings are only some embodiments of the present disclosure. To any one of skill in the art, other drawings may be obtained without any creative work based on the following drawings.

FIG. 7 is a flow chart of a method of manufacturing a circuit board according to a fourth embodiment of the present disclosure.

DETAILED DESCRIPTION

The following is a clear and complete description of the technical solutions in the present disclosure in conjunction with the drawings in the present disclosure. It is clear that the described methods are only part of the present disclosure, but not all of it. Based on the methods described in the present disclosure, all other methods that are obtained by those skilled in the art without creative labor are within the scope of the present disclosure.

Figure 1:
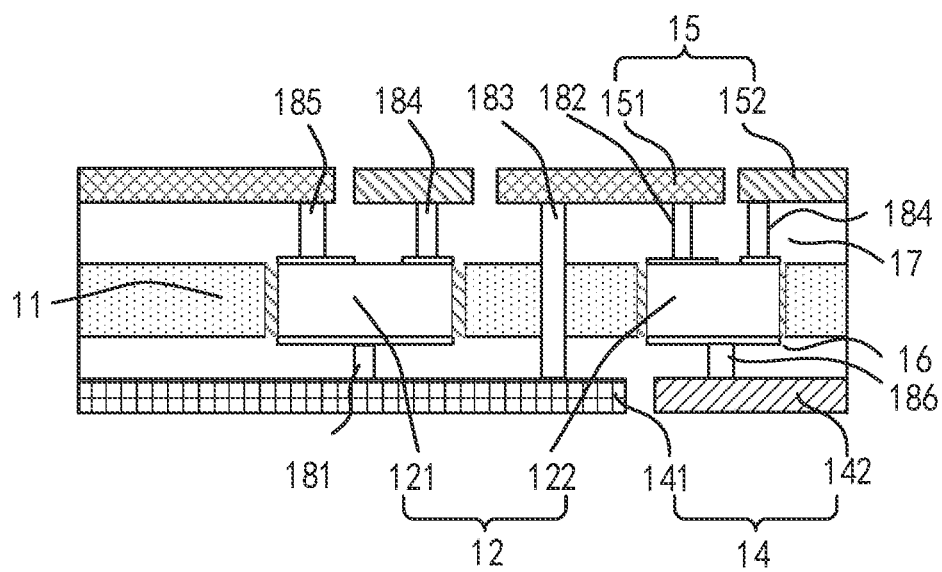
FIG. 1 is a structural schematic view of a circuit board according to a first embodiment of the present disclosure.
Figure 2:
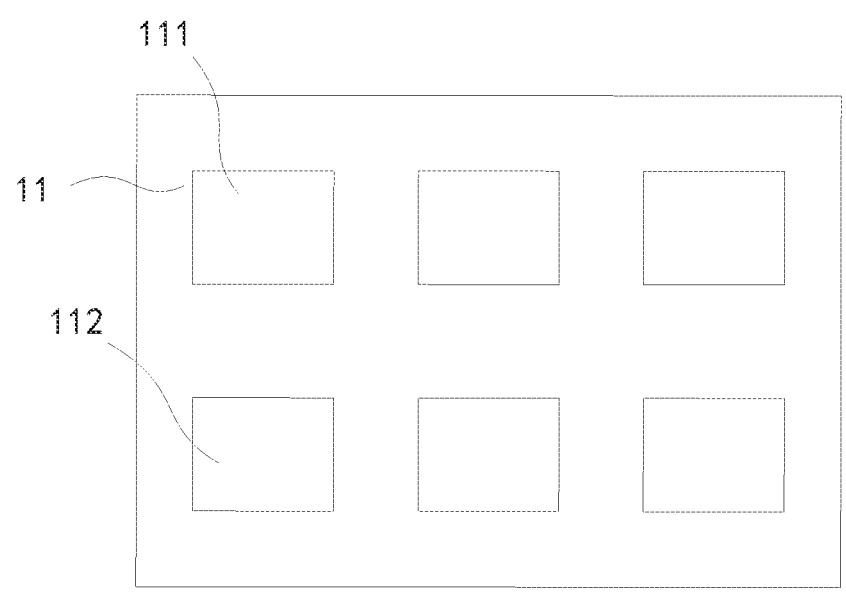
FIG. 2 is a structural schematic view of slots of a circuit board according to another embodiment of the present disclosure.

As shown in FIG. 1, FIG. 1 is a structural schematic view of a circuit board according to a first embodiment of the present disclosure. In the embodiment, the circuit board may include a core board 11 and a chip assembly 12. The core board 11 defines a plurality of slots, as shown in FIG. 2. The plurality of slots include a plurality of first sub-slots 111 and a plurality of second sub-slots 112 disposed beneath the plurality of first sub-slots 111. In the embodiment, the first sub-slots 111 and second sub-slots 112 are arranged in an array. Each of the second sub-slots 112 is located beneath a corresponding first sub-slot 111. The chip assembly 12 includes a plurality of first chips 121 arranged in the first sub-slots 111 and a plurality of second chips 122 arranged in the second sub-slots 112. The embodiment is illustrated with three first chips 121 and three second chips 122 as an example. The structure shown in FIG. 1 is a side view of the circuit board.

In the embodiment, one of the first chips 121 is placed correspondingly in one first sub-slot 111, and one of the second chips 122 is placed correspondingly in one second sub-slot 113. In other embodiments, a plurality of chips may be placed in one slot. The embodiment is illustrated by one single chip placed in one slot as an example.

The circuit board shown in FIG. 1 also includes a first line layer 15 and a second line layer 14. The first line layer 15 and the second line layer 14 are disposed on both sides of the core board 11, respectfully. The first line layer 15 is connected to the core board 11 via a first insulating layer 17. The second line layer 14 is connected to the core board 11 via a second insulating layer 16. Specifically, the first insulating layer 17 is disposed between the core board 11 and the first line layer 15 for connecting the core board 11 to the first line layer 15. The second insulating layer 16 is disposed between the core board 11 and the second line layer 14 for connecting the core board 11 to the second line layer 14.

In the present disclosure, the material of the core board 11 may be a copper-clad board. The copper-clad board is a basic material for manufacturing circuit boards. The copper-clad board may include a substrate board and a copper foil covering the substrate. The substrate board may be made of paper substrate, glass fiber cloth substrate, synthetic fiber cloth substrate, non-woven cloth substrate, composite substrate and other materials dipped in resin to make a connecting sheet, and made of a combination of multiple connecting sheets. The copper foil is applied to one or both sides of the manufactured substrate, and then hot pressed and cured to produce the copper-clad board. The first insulating layer 17 and the second insulating layer 16 may be a semi-cured sheet, which is configured as an inter-layer connecting layer for lamination. Specifically, the semi-cured sheet mainly includes resin and reinforcing material. In the production of multilayer circuit boards, fiberglass cloth is usually applied as a reinforcing material, which is impregnated with a resin glue, and then pre-baked by heat treatment to make a sheet. The sheet will soften under heating and pressure, and solidify after cooling, and has a viscous. In a high-temperature laminating process, the sheet can connect two adjacent layers.

In the embodiment, the first chip 121 in the first sub-slot 111 and the second chip 122 in the second sub-slot 112 are connected in series with each other to form a plurality of chipsets. The plurality of chipsets are connected in parallel, i.e., the plurality of chipsets are connected to a first power signal layer at one end and connected to the ground layer at the other end.

Specifically, both the first chip 121 and the second chip 122 include a first connection terminal, a second connection terminal, and a third connection terminal. The second connection terminal and the third connection terminal are located on a side near the first line layer 15. The first connection terminal is located on a side near the second line layer 14. When the first chip 121 and the second chip 122 are connected in series to form the chipset, the first connection terminal of the first chip 121 is connected to the second connection terminal of the second chip 122 corresponding to the position of the first connection terminal. When the chipsets are connected in parallel with each other, the plurality of chipsets are connected to a first power signal layer at one end and connected to the ground layer at the other end.

As shown in FIG. 1, the first line layer 15 of the circuit board in the embodiment includes a first power signal layer 151 and a control signal layer 152. The first power signal layer 151 and the control signal layer 152 are disconnected. The second line layer 14 includes a second power signal layer 141 and a ground layer 142. The second power signal layer 141 and the ground layer 142 are disconnected.

In the embodiment, the second insulating layer 16 defines a first conductive hole 181 at a position corresponding to the first connection terminal of the first chip 121 to connect the second power signal layer 141 to the first connection terminal of the first chip 121. Accordingly, the first insulating layer 17 defines a second conductive hole 182 at a position corresponding to the second connection terminal of the second chip 122 to connect the first power signal layer 151 to the second connection terminal of the second chip 122. A third conductive hole 183 is defined between the first chip 121 and the second chip 122 through the core board 11, the first insulating layer 17, and the second insulating layer 16 to connect the first power signal layer 151 and the second power signal layer 141. In this way, the first connection terminal of the first chip 121 is connected to the second connection terminal of the second chip 122, such that the series connection between the first chip 121 and the second chip 122 is realized.

In the embodiment, the second connection terminals of the first chips 121 are connected to each other. The first connection terminals of the second chips 122 are connected to each other. Specifically, to connect the second connection terminals of the first chips 121 to each other, a fifth conductive hole 185 is defined at a position of the first insulating layer 17 corresponding to the second connection terminal of the first chip 121 to connect the second connection terminals of the first chips 121 to the first power signal layer 151. The second connection terminals of the first chips 121 are connected in parallel via the first power signal layer 151. To connect the first connection terminals of the second chips 122 to each other, a sixth conductive hole 186 is defined at a position of the second insulating layer 16 corresponding to the first connection terminal of the second chip 122 to connect the first connection terminals of the second chips 122 to the ground layer 142. The first connection terminals of the second chips 122 are connected in parallel via the ground layer 142. In this way, connecting the chipsets in parallel with each other may be realized.

Further, in the embodiment, the first insulating layer 17 defines a fourth conductive hole 184 at a position corresponding to the third connection terminal of the first chip 121 and the third connection terminal of the second chip 122. The fourth conductive hole 184 is configured to connect the third connection terminal of the first chip 121 and the third connection terminal of the second chip 122 to the control signal layer 152.

In the embodiment, a plurality of the first chips 121 and the second chips 122 are buried in the circuit board, the first chip 121 and the corresponding second chip 122 are connected in series to form the chipset, such that the buried circuit board may be realized as thin and light, a purpose of short signal transmission distance may be realized and a signal loss may be reduced.

Figure 3:
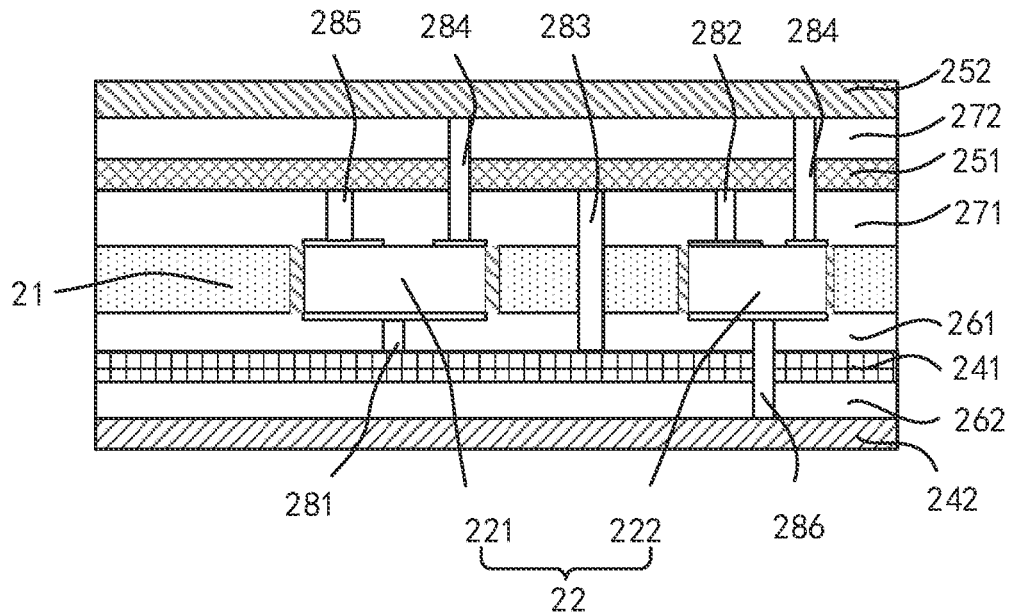
FIG. 3 is a structural schematic view of a circuit board according to a second embodiment of the present disclosure.

As shown in FIG. 3, FIG. 3 is a structural schematic view of a circuit board according to a second embodiment of the present disclosure. In the embodiment, the circuit board may include a core board 21 and a chip assembly 22. The core board 21 defines a plurality of slots. As shown in FIG. 2, the plurality of slots include a plurality of first sub-slots 111 and a plurality of second sub-slots 112 disposed below the plurality of first sub-slots 111. The chip assembly 22 includes a plurality of first chips 221 arranged in the first sub-slots 111 and a plurality of second chips 222 arranged in the second sub-slots 112. The embodiment is illustrated with three first chips 221 and three second chips 222 as an example. The structure shown in FIG. 3 is a side view of the circuit board.

The circuit board shown in FIG. 3 also includes a first power signal layer 251 and a second power signal layer 241. The first power signal layer 251 and the second power signal layer 241 are disposed on both sides of the core board 21, respectively. The first power signal layer 251 is connected to the core board 21 by a first insulating layer 271. The second power signal layer 241 is connected to the core board 21 by a second insulating layer 261. Specifically, the first insulating layer 271 is arranged between the core board 21 and the first power signal layer 251 for connecting the core board 21 to the first power signal layer 251. The second insulating layer 261 is arranged between the core board 21 and the second power signal layer 241 for connecting the core board 21 to the second power signal layer 241.

The circuit board shown in the embodiment also includes a third insulating layer 272, a fourth insulating layer 262, a control signal layer 252, and a ground layer 242. The control signal layer 252 is located on a side of the first power signal layer 251 away from the core board 21. The ground layer 242 is located on a side of the second power signal layer 241 away from the core board 21. The third insulating layer 272 is located between the first power signal layer 251 and the control signal layer 252 for connecting the first power signal layer 251 and the control signal layer 252. The fourth insulating layer 262 is located between the second power signal layer 241 and the ground layer 242 for connecting the second power signal layer 241 and the ground layer 242.

Specifically, both the first chip 221 and the second chip 222 include a first connection terminal, a second connection terminal, and a third connection terminal. When the first chip 221 and the second chip 222 are connected in series to form the chipset, the first connection terminal of the first chip 221 is connected to the second connection terminal of the second chip 222 corresponding to the position of the first connection terminal. When the chipsets are connected in parallel with each other, the plurality of chipsets are connected to the first power signal layer 251 at one end and connected to the ground layer 242 at the other end. Specifically, the second connection terminal of the first chip 221 is connected to the first power signal layer 251, and the first connection terminal of the second chip 222 is connected to the ground layer 242.

As shown in FIG. 3, in the embodiment, the second insulating layer 261 defines a first conductive hole 281 at a position corresponding to the first connection terminal of the first chip 221 to connect the second power signal layer 241 to the first connection terminal of the first chip 221. Accordingly, the first insulating layer 271 defines a second conductive hole 282 at a position corresponding to the second connection terminal of the second chip 222 to connect the first power signal layer 251 to the second connection terminal of the second chip 222. A third conductive hole 283 is defined between the first chip 221 and the second chip 222 through the core board 21, the first insulating layer 271, and the second insulating layer 261 to connect the first power signal layer 251 and the second power signal layer 241. In this way, the first connection terminal of the first chip 221 is connected to the second connection terminal of the second chip 222, such that the series connection between the first chip 221 and the second chip 222 is realized.

In the embodiment, the second connection terminals of the first chips 221 are connected to each other and connected to the first power signal layer 251. The first connection terminals of the second chips 222 are connected to each other and connected to the ground layer 242. Specifically, to connect the second connection terminals of the first chips 221 to each other, a fifth conductive hole 285 is defined at a position of the first insulating layer 271 corresponding to the second connection terminal of the first chip 221 to connect the second connection terminals of the first chips 221 to the first power signal layer 251. The second connection terminals of the first chips 221 are connected in parallel via the first power signal layer 251. To connect each second chip 222 to each other, the first connection terminals of the second chips 222 are connected to each other. A sixth conductive hole 286 is defined at a position of the second insulating layer 261 corresponding to the first connection terminal of the second chip 222 to connect the first connection terminals of the second chips 222 to the ground layer 242. The first connection terminals of the second chips 222 are connected in parallel via the ground layer 242. In this way, connecting the chipsets in parallel with each other may be realized.

Further, in the embodiment, the first insulating layer 271 and the third insulating layer 272 define a fourth conductive hole 284 at a position corresponding to the third connection terminal of the first chip 221 and that of the second chip 222. The fourth conductive hole 284 is configured to connect the third connection terminal of the first chip 221 and that of the second chip 222 to the control signal layer 252.

In the embodiment, a plurality of the first chips 221 and the second chips 222 are buried in the circuit board, the first chip 221 and the corresponding second chip 222 are connected in series to form the chipset, such that the buried circuit board may be realized as thin and light, a purpose of short signal transmission distance may be realized and a signal loss may be reduced.

Figure 4:
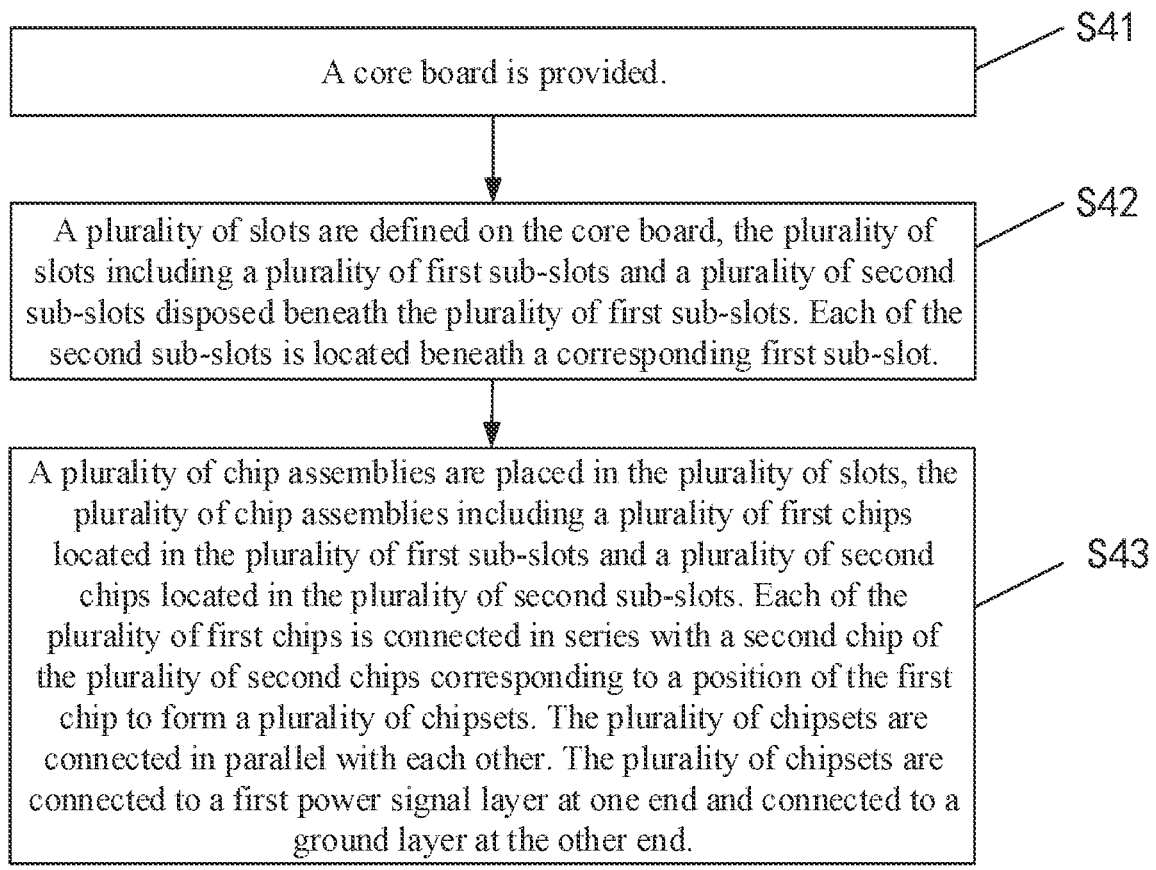
FIG. 4 is a flow chart of a method of manufacturing a circuit board according to a first embodiment of the present disclosure.

As shown in FIG. 4, FIG. 4 is a flow chart of a method of manufacturing a circuit board according to a first embodiment of the present disclosure. In the embodiment, the method include operations at blocks illustrated in FIG. 4.

At block S41: A circuit board is provided.

In the present disclosure, the material of the core board may be a copper-clad board. The copper-clad board is a basic material for manufacturing circuit boards. The copper-clad board may include a substrate board and a copper foil covering the substrate. The substrate board may be made of paper substrate, glass fiber cloth substrate, synthetic fiber cloth substrate, non-woven cloth substrate, composite substrate and other materials dipped in resin to make a connecting sheet, and made of a combination of multiple connecting sheets. The copper foil is applied to one or both sides of the manufactured substrate, and then hot pressed and cured to produce the copper-clad board.

At block S42: A plurality of slots are defined on the core board, the plurality of slots including a plurality of first sub-slots and a plurality of second sub-slots disposed beneath the plurality of first sub-slots. Each of the second sub-slots is located beneath a corresponding first sub-slot.

The slot is opened on the core board by etching, laser drilling, mechanical drilling, etc. In the present disclosure, since the chips are placed in an array, the slot include a first sub-slot and a second sub-slot disposed beneath the first sub-slot. The second sub-slots is located beneath the corresponding first sub-slot.

At block S43: A plurality of chip assemblies are placed in the plurality of slots, the plurality of chip assemblies including a plurality of first chips located in the plurality of first sub-slots and a plurality of second chips located in the plurality of second sub-slots. Each of the plurality of first chips is connected in series with a second chip of the plurality of second chips corresponding to a position of the first chip to form a plurality of chipsets. The plurality of chipsets are connected in parallel with each other. The plurality of chipsets are connected to a first power signal layer at one end and connected to a ground layer at the other end.

A plurality of chip assemblies is placed in the plurality of slots, the plurality of chip assemblies including a plurality of first chips located in the plurality of first sub-slots and a plurality of second chips located in the plurality of second sub-slots. Each of the plurality of first chips is connected in series with a corresponding second chip of the plurality of second chips to form a plurality of chipsets. The plurality of chipsets are connected in parallel with each other. That is, the plurality of chipsets are connected to a first power signal layer at one end and connected to a ground layer at the other end.

Figure 5:
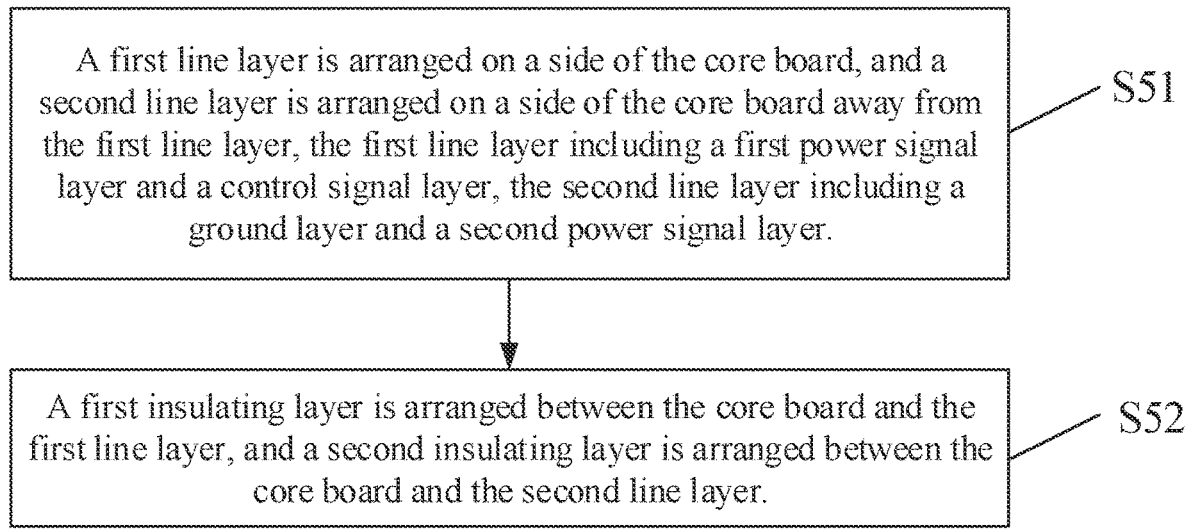
FIG. 5 is a flow chart of a method of manufacturing a circuit board according to a second embodiment of the present disclosure.

Specifically, as shown in FIG. 5, FIG. 5 is a flow chart of a method of manufacturing a circuit board according to a second embodiment of the present disclosure. Compared to the first embodiment shown in FIG. 4 above, the difference of the second embodiment is that the method further includes operations as followed after operation S43.

At block S51: A first line layer is arranged on a side of the core board, and a second line layer is arranged on a side of the core board away from the first line layer, the first line layer including a first power signal layer and a control signal layer, the second line layer including a ground layer and a second power signal layer.

A first line layer and a second line layer are arranged on both sides of the core board, respectively. Specifically, the first line layer and the second line layer are both line networks made on the copper layer. The first power signal layer and the control signal layer are different line networks on the first line layer. The ground line layer and the second power signal layer are different line networks on the second line layer.

At block S52: A first insulating layer is arranged between the core board and the first line layer, and a second insulating layer is arranged between the core board and the second line layer.

A first insulating layer is arranged between the core board and the first line layer to connect the core board to the first line layer. A second insulating layer is arranged between the core board and the second line layer to connect the core board to the second line layer. Specifically, the first insulating layer and the second insulating layer may be a semi-cured sheet, which is configured as an inter-layer connecting layer for lamination. Specifically, the semi-cured sheet mainly includes resin and reinforcing material. In the production of multilayer circuit boards, fiberglass cloth is usually applied as a reinforcing material, which is impregnated with a resin glue, and then pre-baked by heat treatment to make a sheet. The sheet will soften under heating and pressure, and solidify after cooling, and has a viscous. In a high-temperature laminating process, the sheet can connect two adjacent layers.

Figure 6:
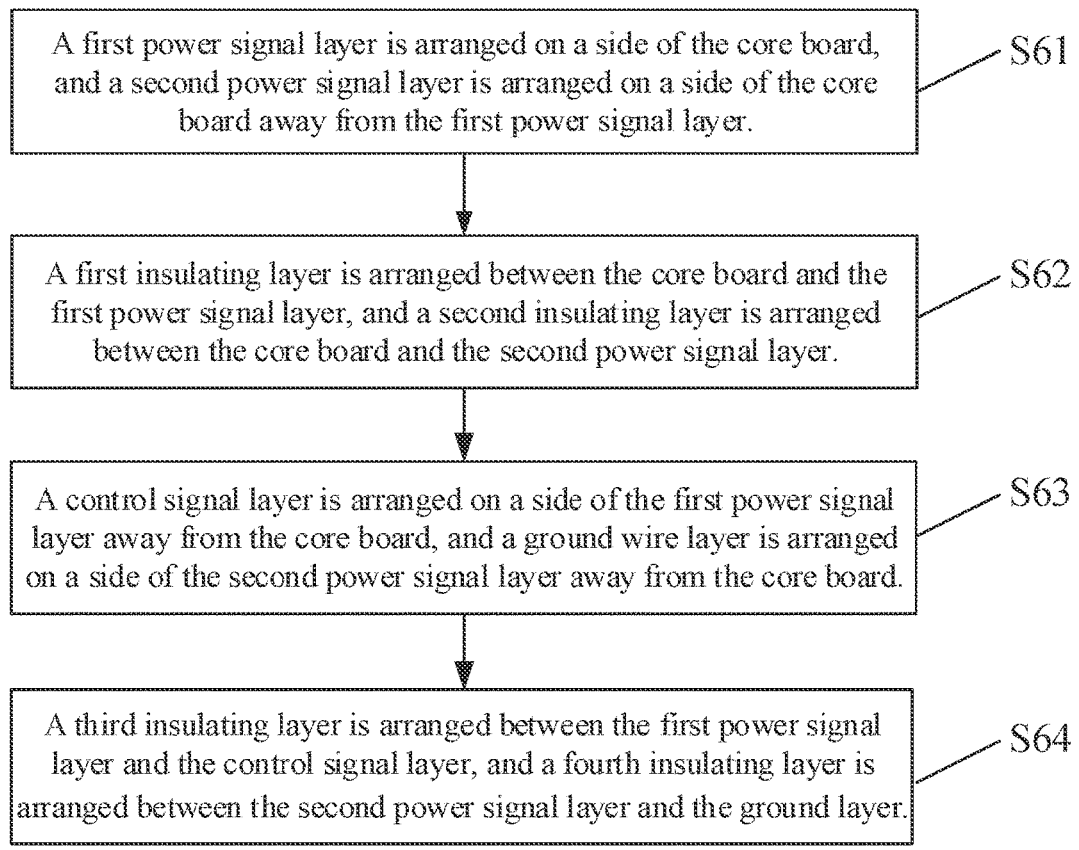
FIG. 6 is a flow chart of a method of manufacturing a circuit board according to a third embodiment of the present disclosure.

As shown in FIG. 6, FIG. 6 is a flow chart of a method of manufacturing a circuit board according to a third embodiment of the present disclosure. Compared to the first embodiment shown in FIG. 4 above, the difference of the third embodiment is that the method further includes operations as followed after operation S43.

At block S61: A first power signal layer is arranged on a side of the core board, and a second power signal layer is arranged on a side of the core board away from the first power signal layer.

A first power signal layer and a second power signal layer are both located on both sides of the core board, and the first power signal layer and the second power signal layer are line layers made of copper.

At block S62: A first insulating layer is arranged between the core board and the first power signal layer, and a second insulating layer is arranged between the core board and the second power signal layer.

A first insulating layer and a second insulating layer are semi-cured sheets, which will not be repeated here.

At block S63: A control signal layer is arranged on a side of the first power signal layer away from the core board, and a ground wire layer is arranged on a side of the second power signal layer away from the core board.

The control signal layer and the ground line layer are also line layers made of copper. Specifically, the control signal layer is located on an outside of the first power signal layer, and the ground wire layer is located on an outside of the second power signal layer.

At block S64: A third insulating layer is arranged between the first power signal layer and the control signal layer, and a fourth insulating layer is arranged between the second power signal layer and the ground layer.

The fourth and third insulating layers are the same as the first and second insulating layers, both of which are semi-cured and will not be repeated here.

As shown in FIG. 7, FIG. 7 is a flow chart of a method of manufacturing a circuit board according to a fourth embodiment of the present disclosure. Compared to the second embodiment shown in FIG. 5 and the third embodiment shown in FIG. 6 above, the difference of the fourth embodiment is that the method further includes operations as followed.

At block S71: The second insulating layer defines a first conductive hole at a position corresponding to the first connection terminal of the first chip, the first insulating layer defines a second conductive hole at a position corresponding to the second connection terminal of the second chip, a third conductive hole is defined between the first chip and the second chip through the core board, the first insulating layer, and the second insulating layer. In this way, the first connection terminal of the first chip is connected to the second connection terminal of the second chip.

Due to the first conductive hole through which the second power signal layer is connected to the first connection terminal of the first chip, and the second conductive hole through which the first power signal layer is connected to the second connection terminal of the second chip, and the third conductive hole through which the first power signal layer is connected to the second power signal layer, the first connection terminal of the first chip is connected to the second connection terminal of the second chip, such that the series connection between the first chip and the second chip is realized to form the chipset.

At block S72: A fifth conductive hole is defined at a position of the first insulating layer corresponding to the second connection terminal of the first chip to connect the second connection terminals of the first chips to the first power signal layer. A sixth conductive hole is defined at a position of the second insulating layer corresponding to the first connection terminal of the second chip to connect the first connection terminals of the second chips to the ground layer.

The fifth conductive hole connects the second connection terminal of the first chip to the first power signal layer, and the sixth conductive hole connects the first connection terminal of the second chip to the ground layer to connect the chipsets in parallel with each other.

At block S73: A fourth conductive hole is defined at a position of the first insulating layer corresponding to the third connection terminal of the first chip and that of the second chip to connect the third connection terminals of the first chip and the second chip to the control signal layer.

The fourth conductive hole connects the third connection terminal of the first chip and the third connection terminal of the second chip to the control signal layer.

In the circuit board and the manufacturing method of the present disclosure, a plurality of chips are arranged in an array and buried in the circuit board, such that the circuit board may be realized as thin and light. The plurality of chips are regularly connected in series and in parallel on the circuit board, such that the signal transmission distance is short and the signal loss is reduced.

The above description is for the purpose of illustrating implementations of the present disclosure, but not to limit the scope of the present disclosure. Any equivalent structural or process transformation performed based on the drawings and the specification of the present disclosure, applied directly and indirectly in other related art, should be within the scope of the present disclosure.

What is claimed is:

1. A circuit board, comprising:
   a core board, defining a plurality of slots, the plurality of slots comprising a plurality of first sub-slots and a plurality of second sub-slots disposed beneath the plurality of first sub-slots; wherein each of the second sub-slots is located beneath a corresponding first sub-slot of the plurality of first sub-slots; and
   a plurality of chip assemblies, arranged in the plurality of slots and comprising a plurality of first chips located in the plurality of first sub-slots and a plurality of second chips located in the plurality of second sub-slots;
   wherein each of the plurality of first chips is connected in series with one of the plurality of second chips at a corresponding position to form a plurality of chipsets; the plurality of chipsets are connected in parallel with each other; an end of the plurality of chipsets is connected to a first power signal layer, and the other end of the plurality of chipsets is connected to a ground layer;
   wherein each of the plurality of first chips has a connection terminal set; the connection terminal set consists of a first connection terminal, a second connection terminal, and a third connection terminal; the second connection terminal and the third connection terminal are arranged on a side near the first power signal layer, and the first connection terminal is arranged on a side near the ground layer;
   wherein each of the plurality of second chips has a connection terminal set; the connection terminal set consists of a first connection terminal, a second connection terminal, and a third connection terminal; the second connection terminal and the third connection terminal are arranged on a side near the first power signal layer, and the first connection terminal is arranged on a side near the ground layer;
   the first connection terminal of one of the plurality of first chips is coupled to the second connection terminal of one of the plurality of second chips at a corresponding position; the second connection terminal of one of the plurality of first chips is coupled to the first power signal layer; the first connection terminal of one of the plurality of second chips is connected to the ground layer.

2. The circuit board according to claim 1, further comprising:
   a first line layer, arranged on a side of the core board;
   a second line layer, arranged on a side of the core board away from the first line layer;
   a first insulating layer, arranged between the core board and the first line layer; and
   a second insulating layer, arranged between the core board and the second line layer;
   wherein the first line layer comprises the first power signal layer and a control signal layer; the second line layer comprises the ground layer and a second power signal layer.

3. The circuit board according to claim 2, wherein the third connection terminal of one of the plurality of first chips is coupled to the control signal layer; the third connection terminal of one of the plurality of second chips is coupled to the control signal layer.

4. The circuit board according to claim 3, wherein a first conductive hole is defined at a position of the second insulating layer corresponding to the first connection terminal of one of the plurality of first chips, to connect the second power signal layer to the first connection terminal of one of the plurality of first chips;
   a second conductive hole is defined at a position of the first insulating layer corresponding to the second connection terminal of one of the plurality of second chips, to connect the first power signal layer to the second connection terminal of one of the plurality of second chips;
   a third conductive hole is defined between one of the plurality of first chips and one of the plurality of second chips, to connect the first power signal layer to the second power signal layer, such that the first connection terminal of one of the plurality of first chips is connected to the second connection terminal of one of the plurality of second chips; each of the plurality of first chips and one of the plurality of second chips at a corresponding position are thus connected in series to form the plurality of chipsets.

5. The circuit board according to claim 4, wherein a fourth conductive hole is defined at a position of the first insulating layer corresponding to the third connection terminal of one of the plurality of first chips and the third connection terminal of one of the plurality of second chips to connect the third connection terminal of one of the plurality of first chips and the third connection terminal of one of the plurality of second chips to the control signal layer.

6. The circuit board according to claim 4, wherein,
   a fifth conductive hole is defined at a position of the first insulating layer corresponding to the second connection terminal of one of the plurality of first chips to connect the second connection terminal of one of the plurality of first chips to the first power signal layer;
   a sixth conductive hole is defined at a position of the second insulating layer corresponding to the first connection terminal of one of the plurality of second chips to connect the first connection terminal of one of the plurality of second chips to the ground layer.

7. The circuit board according to claim 1, further comprising:
the first power signal layer, arranged on a side of the core board;
a second power signal layer, arranged on a side of the core board away from the first power signal layer;
a first insulating layer, arranged between the core board and the first power signal layer;
a second insulating layer, arranged between the core board and the second power signal layer;
a control signal layer, arranged on a side of the first power signal layer away from the core board;
the ground layer, arranged on a side of the second power signal layer away from the core board;
a third insulating layer, arranged between the first power signal layer and the control signal layer; and
a fourth insulating layer, arranged between the second power signal layer and the ground layer.

8. The circuit board according to claim 7, wherein the third connection terminal of one of the plurality of first chips is coupled to the control signal layer; the third connection terminal of one of the plurality of second chips is coupled to the control signal layer.

9. The circuit board according to claim 8, wherein a first conductive hole is defined at a position of the second insulating layer corresponding to the first connection terminal of one of the plurality of first chips, to connect the second power signal layer to the first connection terminal of one of the plurality of first chips;
a second conductive hole is defined at a position of the first insulating layer corresponding to the second connection terminal of one of the plurality of second chips, to connect the first power signal layer to the second connection terminal of one of the plurality of second chips;
a third conductive hole is defined between one of the plurality of first chips and one of the plurality of second chips, to connect the first power signal layer to the second power signal layer, such that the first connection terminal of one of the plurality of first chips is connected to the second connection terminal of one of the plurality of second chips; each of the plurality of first chips and one of the plurality of second chips at a corresponding position are thus connected in series to form the plurality of chipsets.

10. The circuit board according to claim 8, wherein a fourth conductive hole is defined at a position of the first insulating layer corresponding to the third connection terminal of one of the plurality of first chips and the third connection terminal of one of the plurality of second chips, and defined at a position of the third insulating layer corresponding to the third connection terminal of one of the plurality of first chips and the third connection terminal of one of the plurality of second chips, to connect the third connection terminal of one of the plurality of first chips and the third connection terminal of one of the plurality of second chips to the control signal layer.

11. The circuit board according to claim 8, wherein,
a fifth conductive hole is defined at a position of the first insulating layer corresponding to the second connection terminal of one of the plurality of first chips to connect the second connection terminal of one of the plurality of first chips to the first power signal layer;
a sixth conductive hole is defined at a position of the second insulating layer corresponding to the first connection terminal of one of the plurality of second chips, and defined at a position of the fourth insulating layer corresponding to the first connection terminal of one of the plurality of second chips, to connect the first connection terminal of one of the plurality of second chips to the ground layer.

12. A method for manufacturing a circuit board, comprising:
providing a circuit board;
defining a plurality of slots on a core board, the plurality of slots comprising a plurality of first sub-slots and a plurality of second sub-slots disposed beneath the plurality of first sub-slots; wherein each of the plurality of second sub-slots is located beneath a corresponding first sub-slot of the plurality of first sub-slots; and
arranging a plurality of chip assemblies in the plurality of slots, the plurality of chip assemblies comprising a plurality of first chips located in the plurality of first sub-slots and a plurality of second chips located in the plurality of second sub-slots; wherein each of the plurality of first chips is connected in series with one of the plurality of second chips at a corresponding position to form a plurality of chipsets; the plurality of chipsets are connected in parallel with each other; an end of the plurality of chipsets is connected to a first power signal layer, and the other end of the plurality of chipsets is connected to a ground layers;
wherein each of the plurality of first chips has a connection terminal set the connection terminal set consists of a first connection terminal, a second connection terminal, and a third connection terminal; the second connection terminal and the third connection terminal are arranged on a side near the first power signal layer, and the first connection terminal is arranged on a side near the ground layer;
wherein each of the plurality of second chips has a connection terminal set the connection terminal set consists of a first connection terminal, a second connection terminal, and a third connection terminal; the second connection terminal and the third connection terminal are arranged on a side near the first power signal layer, and the first connection terminal is arranged on a side near the ground layer;
the first connection terminal of one of the plurality of first chips is coupled to the second connection terminal of one of the plurality of second chips at a corresponding position; the second connection terminal of one of the plurality of first chips is coupled to the first power signal layer; the first connection terminal of one of the plurality of second chips is connected to the ground layer.

13. The method according to claim 12, wherein after the arranging the plurality of chip assemblies in the plurality of slots, the method further comprises:
arranging a first line layer on a side of the core board, and arranging a second line layer on a side of the core board away from the first line layer, the first line layer comprising the first power signal layer and a control signal layer, the second line layer comprising the ground layer and a second power signal layer; and
arranging a first insulating layer between the core board and the first line layer, and arranging a second insulating layer between the core board and the second line layer.

14. The method according to claim 13, further comprising:
defining a first conductive hole at a position of the second insulating layer corresponding to the first connection terminal of one of the plurality of first chips, defining a second conductive hole at a position of the first insulating layer corresponding to the second connection terminal of one of the plurality of second chips, and defining a third conductive hole between one of the plurality of first chips and one of the plurality of second chips through the core board, the first insulating layer, and the second insulating layer, such that the first connection terminal of one of the plurality of first chips is connected to the second connection terminal of one of the plurality of second chips;
defining a fifth conductive hole at a position of the first insulating layer corresponding to the second connection terminal of one of the plurality of first chips to connect the second connection terminal of one of the plurality of first chips to the first power signal layer; and
defining a sixth conductive hole at a position of the second insulating layer corresponding to the first connection terminal of one of the plurality of second chips to connect the first connection terminal of one of the plurality of second chips to the ground layer; and
defining a fourth conductive hole at a position of the first insulating layer corresponding to the third connection terminal of one of the plurality of first chips and the third connection terminal of one of the plurality of second chips to connect the third connection terminal of one of the plurality of first chips and the third connection terminal of one of the plurality of second chips to the control signal layer.

15. The method according to claim 12, wherein after the arranging the plurality of chip assemblies in the plurality of slots, the method further comprises:
arranging a first power signal layer on a side of the core board, and arranging a second power signal layer on a side of the core board away from the first power signal layer;
arranging a first insulating layer between the core board and the first power signal layer, and arranging a second insulating layer between the core board and the second power signal layer;
arranging a control signal layer on a side of the first power signal layer away from the core board, and arranging a ground wire layer on a side of the second power signal layer away from the core board; and
arranging a third insulating layer between the first power signal layer and the control signal layer, and arranging a fourth insulating layer between the second power signal layer and the ground layer.

16. The method according to claim 15, further comprising:
defining a first conductive hole at a position of the second insulating layer corresponding to the first connection terminal of one of the plurality of first chips, defining a second conductive hole at a position of the first insulating layer corresponding to the second connection terminal of one of the plurality of second chips, and defining a third conductive hole between one of the plurality of first chips and one of the plurality of second chips through the core board, the first insulating layer, and the second insulating layer, such that the first connection terminal of one of the plurality of first chips is connected to the second connection terminal of one of the plurality of second chips;
defining a fifth conductive hole at a position of the first insulating layer corresponding to the second connection terminal of one of the plurality of first chips to connect the second connection terminal of one of the plurality of first chips to the first power signal layer;
defining a sixth conductive hole at a position of the second insulating layer corresponding to the first connection terminal of one of the plurality of second chips, and defining the sixth conductive hole at a position of the fourth insulating layer corresponding to the first connection terminal of one of the plurality of second chips, to connect the first connection terminal of one of the plurality of second chips to the ground layer; and
defining a fourth conductive hole at a position of the first insulating layer corresponding to the third connection terminal of one of the plurality of first chips and the third connection terminal of one of the plurality of second chips, and defining the fourth conductive hole at a position of the third insulating layer corresponding to the third connection terminal of one of the plurality of first chips and the third connection terminal of one of the plurality of second chips, to connect the third connection terminal of one of the plurality of first chips and the third connection terminal of one of the plurality of second chips to the control signal layer.

* * * * *